(12) United States Patent
Chen et al.

(10) Patent No.: US 8,421,020 B2
(45) Date of Patent: Apr. 16, 2013

(54) INFRARED SENSING DEVICE

(75) Inventors: Weigen Chen, Shanghai (CN); Yifeng Wang, Shanghai (CN); Jian Zhang, Shanghai (CN)

(73) Assignee: Shanghai Kohler Electronics, Ltd., Shanghai (CN)

( * ) Notice: Subject to any disclaimer, the term of this patent is extended or adjusted under 35 U.S.C. 154(b) by 304 days.

(21) Appl. No.: 12/864,744

(22) PCT Filed: Jan. 20, 2009

(86) PCT No.: PCT/CN2009/000085
§ 371 (c)(1),
(2), (4) Date: Aug. 24, 2010

(87) PCT Pub. No.: WO2009/094898
PCT Pub. Date: Aug. 6, 2009

(65) Prior Publication Data
US 2010/0308224 A1  Dec. 9, 2010

(30) Foreign Application Priority Data

Jan. 29, 2008 (CN) .......................... 2008 1 0033226

(51) Int. Cl.
*E03C 1/05* (2006.01)
*G01J 5/02* (2006.01)

(52) U.S. Cl.
USPC ............................................... 250/353; 4/623

(58) Field of Classification Search ....... 4/623; 250/353
See application file for complete search history.

(56) References Cited

U.S. PATENT DOCUMENTS

| 4,767,922 A | 8/1988 | Stauffer |
| 5,458,147 A | 10/1995 | Mauerhofer |
| 5,758,688 A | 6/1998 | Hamanaka et al. |
| 5,984,262 A | 11/1999 | Parsons et al. |

FOREIGN PATENT DOCUMENTS

| CN | 1355393 A | 6/2002 |
| CN | 2648524 Y | 10/2004 |
| CN | 2709748 Y | 7/2005 |
| CN | 101220883 A | 7/2008 |
| EP | 448421 A1 * | 9/1991 |
| EP | 623710 A1 * | 11/1994 |
| JP | 06146356 A * | 5/1994 |
| JP | 2002-270889 A | 9/2002 |

* cited by examiner

*Primary Examiner* — Constantine Hannaher
(74) *Attorney, Agent, or Firm* — Foley & Lardner LLP

(57) ABSTRACT

An infrared sensing device mounted in the faucet for a wash basin. The device includes a housing, an emitting lens for focusing the emitted infrared light, and a receiving lens for focusing the reflected infrared light. The optical center of the emitting lens is biased to cause the emitted light to deviate from the basin and from a water column flowing from the faucet.

13 Claims, 4 Drawing Sheets

INFRARED SENSING DEVICE

FIELD OF THE INVENTION

The present invention relates to an infrared sensing device, and more particularly to an infrared sensing device applied to kitchen and sanitary area.

BACKGROUND OF THE INVENTION

In modern life, the infrared sensing device is applied in the kitchen and the sanitary area universally, and especially, the automatic sensing faucet is applied to the top grade sites like hotels broadly, and to home environment gradually. The automatic sensing faucet detects the hands of user in the toilet, and detects the basins and pots etc. in the kitchen, and it automatically discharges the water after finding the objects. This sort of automatic faucet is widely accepted for its convenience, health and water saving. And most sensors mounted in the automatic faucet for detecting the object use the infrared sensing devices.

The followings are the illustration by means of an automatic sensing faucet.

On the one hand, the general infrared sensing device is mounted in the main body of the faucet which is near the basin in the prior arts. Mounted in this way, the device detects the hands of users and gives the sensing signals when users stretch out the hands close to the mouth of the faucet, and further controls the faucet to discharge the water by controlling the control unit. However, the sensing device of this automatic sensing faucet detects not only user's hands, but also the water column from the faucet. In this way, the water column reflects the infrared light and will impact the infrared sensing device; as a result, the error act comes, such as the faucet can not be closed after using.

On the other hand, the automatic sensing faucet is usually mounted in the container which can discharge and drain the water, such as mounted in the washbasin and lavabo in the toilet as well as the sink in the kitchen etc. And the material of the washbasin and lavabo are ceramics, some with strong luster. And said materials could be the stainless steel and glass besides ceramics. For example, the material of the sink in the kitchen is the stainless steel. In such occasions, even the sensor is far away from the washbasin and the sink, the infrared light from the sensor also has specular reflection on the surfaces of these containers, and the reflected light is very strong. However, the infrared sensing device makes the wrong acts for it is easily influenced by the infrared light reflected from the washbasin or sink, for instance the faucet discharges water disorderly even nobody is using.

As a result, as the infrared light has a quality of light emission, said automatic sensing faucet in the prior arts easily discharges the water in wrong order and can not be turned off after using etc. for the wrong act of the automatic sensing device, which impacts the practicality of the product seriously and wastes the water resources.

To sum up, it is necessary to research a kind of infrared sensing device which is easier, more economical and more practical to find a solution for many defects and shortcomings in the prior arts.

SUMMARY OF THE INVENTION

The object of this invention is to provide an infrared sensing device that is easy and practical.

The object of this invention can be realized by the following technical solution: an infrared sensing device mounted in the faucet comprises an infrared emitting tube for emitting the infrared light, an infrared receiving tube for receiving the infrared reflected light, a housing for accommodating the infrared emitting and receiving tubes, an emitting lens which is set correspondingly to the infrared emitting tube to focus the infrared emitted light, and a receiving lens which is set corresponding to the infrared receiving tube to focus the infrared reflected light. The optical center of said emitting lenses is biased to enable the emitted light from the infrared emitting tube to have certain of angles of deflection after passing through the emitting lens.

The object of this invention also can be realized by the following technical solution: an infrared sensing device mounted in the faucet of basin comprises an infrared emitting tube for emitting the infrared light, an infrared receiving tube for receiving the infrared light, a circuit board on which the infrared emitting and receiving tubes are mounted, a housing which accommodates the infrared emitting and receiving tubes, an emitting lens for focusing infrared emitted light, and a receiving lens for focusing the infrared reflected light. The optical center of the emitting lens is biased to left or right, which enables the emitted light to be reflected to deviate from the water column from the faucet, meanwhile, the optical center of the emitting lens is also biased up, which enables the emitting light to deviate from the basin.

The object of this invention further can be realized by the following technical solution: an infrared sensing device comprises the infrared emitting and receiving devices; the infrared emitting device emits the infrared light to the object or the object area, and the infrared reflected light is received by the infrared receiving device. This infrared sensing device also comprises a lens for focusing the infrared light and controlling the direction of the infrared light, which enables the emitting light to deviate from the barrier and shoot at the object or the object area.

Compared with the prior arts, the sensing effect of the infrared sensing device of this invention is better, more economical and more practical, and costs lower.

DETAILED DESCRIPTION OF THE INVENTION

Referred to the attached drawings, the followings are the detailed introductions for various kinds of embodiments of this invention. The same structure parts or functions are marked with the same numbers on the drawings. What should be pointed out is that the drawings are used to describe the embodiments of this invention, not the unnecessary statement or restriction to the scope of the present invention. Besides, there is no need to draw the attached drawings proportionally.

Figure 1:
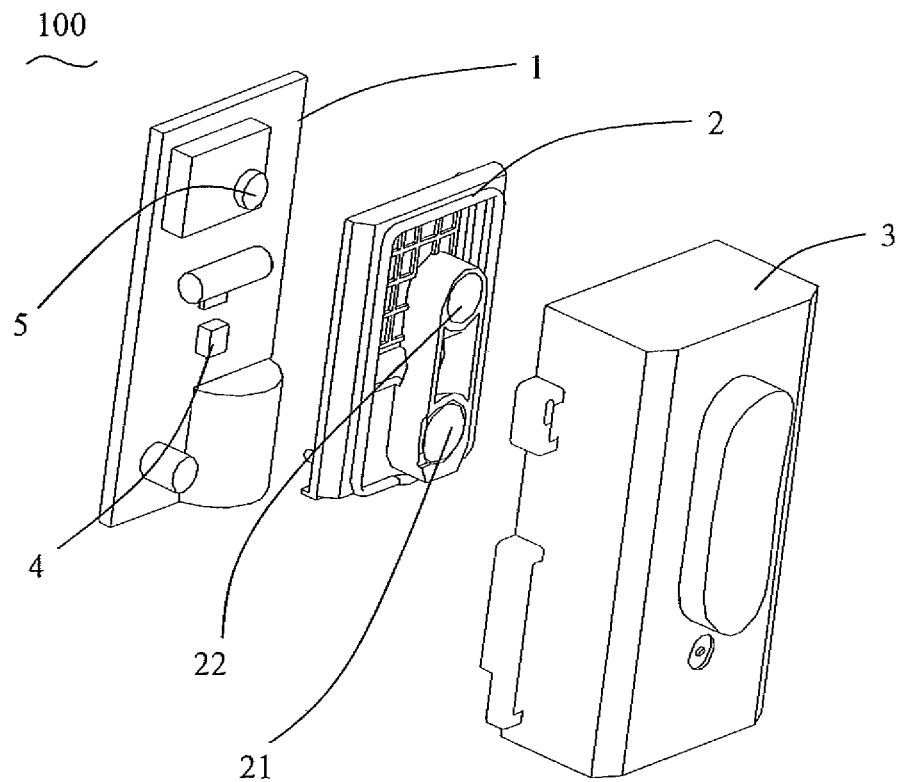
FIG. 1 is the three-dimensional and detached figure for the infrared sensing device of the present invention.

As FIG. 1 shown, the infrared sensing device 100 of the present invention comprises a circuit board 1, a support branch 2 and a housing 3, wherein an infrared emitting tube 4 and an infrared receiving tube 5 are mounted in said circuit board 1. And an emitting lens 6 and a receiving lens 7 are mounted in said housing 3 correspond to the infrared emitting tube 4 and the infrared receiving tube 5 respectively. Said emitting lens 6 enables the light emitted from the infrared emitting tube 4 to be sent out effectively, and the receiving lens 7 can receive the light and send it to the infrared receiving tube 5 effectively.

Among them, the circuit board 1 comprises a PCB board and the corresponding electronic components of which function is to supply power for the infrared emitting tube 4 and the infrared receiving tube 5, and convert the light signals from the infrared receiving tube 5 to the electric signals out.

This circuit board 1 also can be set outside the infrared sensing device 100 according to the space or the installation requirements. And said infrared emitting tube 4 and infrared receiving tube 5 are set inside the housing 3, connecting to the circuit board 1 electronically.

The support branch 2 is a black component functioned as supporting the circuit board 1 and keeping out the infrared light, thus it enables the infrared light emitted by the infrared emitting tube 4 to be transmitted to the emitting lens 6 only and to be focused to go out; and it enables the infrared receiving tube 5 only receives the light from the receiving lens 7. This support branch 2 has a channel 21 for emitting infrared light and a channel 22 for receiving infrared light.

Figure 2:
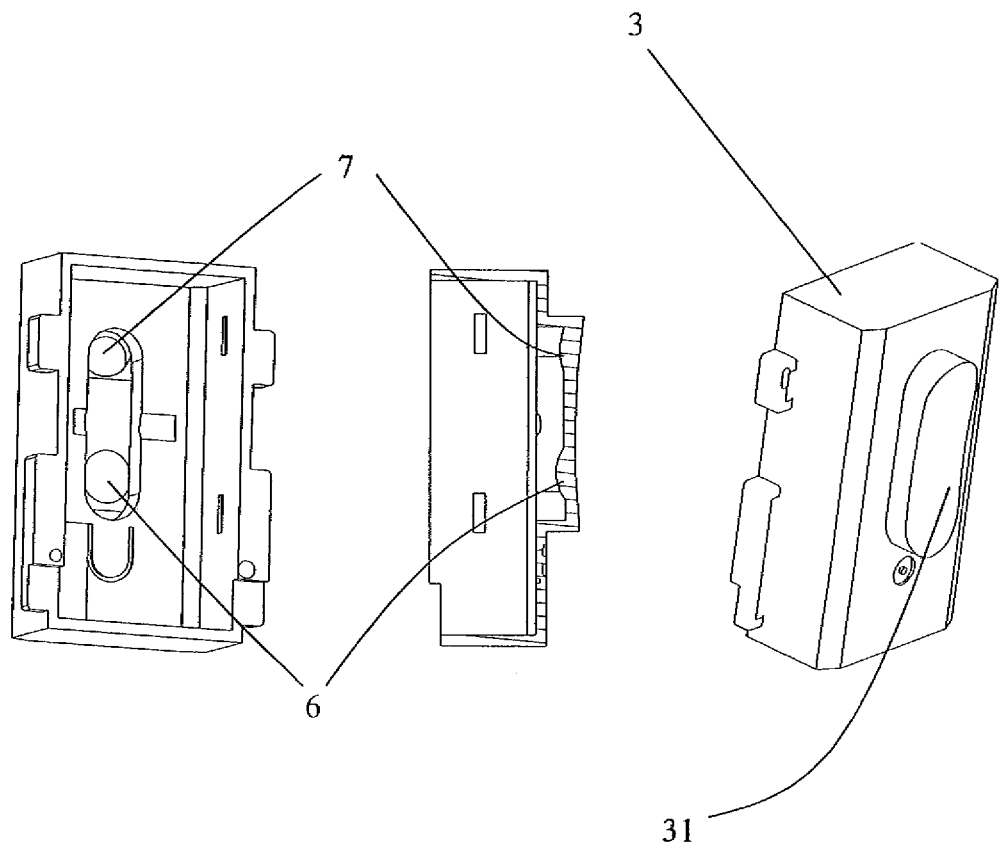
FIG. 2 is the three-dimensional view for the housing of the infrared sensing device of the present invention.

As shown in FIG. 2, the housing 3 is a transparent part, and each one channel corresponding to each position of the infrared emitting tube 4 and the infrared receiving tube 5 is set on the housing. The spherical bulge is designed to be like that, the middle is thick and the edges are thin, formed as the emitting lens 6 and the receiving lens 7. The function of the lenses is to focus the infrared light and control its direction.

In other preferred embodiment of the infrared sensing device 100 in the present invention, the housing 3 can be made with the transparent parts as the structures of the emitting lens 6 and receiving lens 7 and at the edge (outside of the lens structures) with the opaque.

In another preferred embodiment of the infrared sensing device 100 in the present invention, the prefabricated emitting lens 6 and the receiving lens 7 are mounted at the housing 3 by the way of fastener etc.

In another embodiment of the infrared sensing device 100 in the present invention, the support branch 2 can be set to a whole with the housing 3 instead of they are set separately, formed as the channel for emitting infrared light and channel for receiving infrared light in the housing 3.

Figure 3:
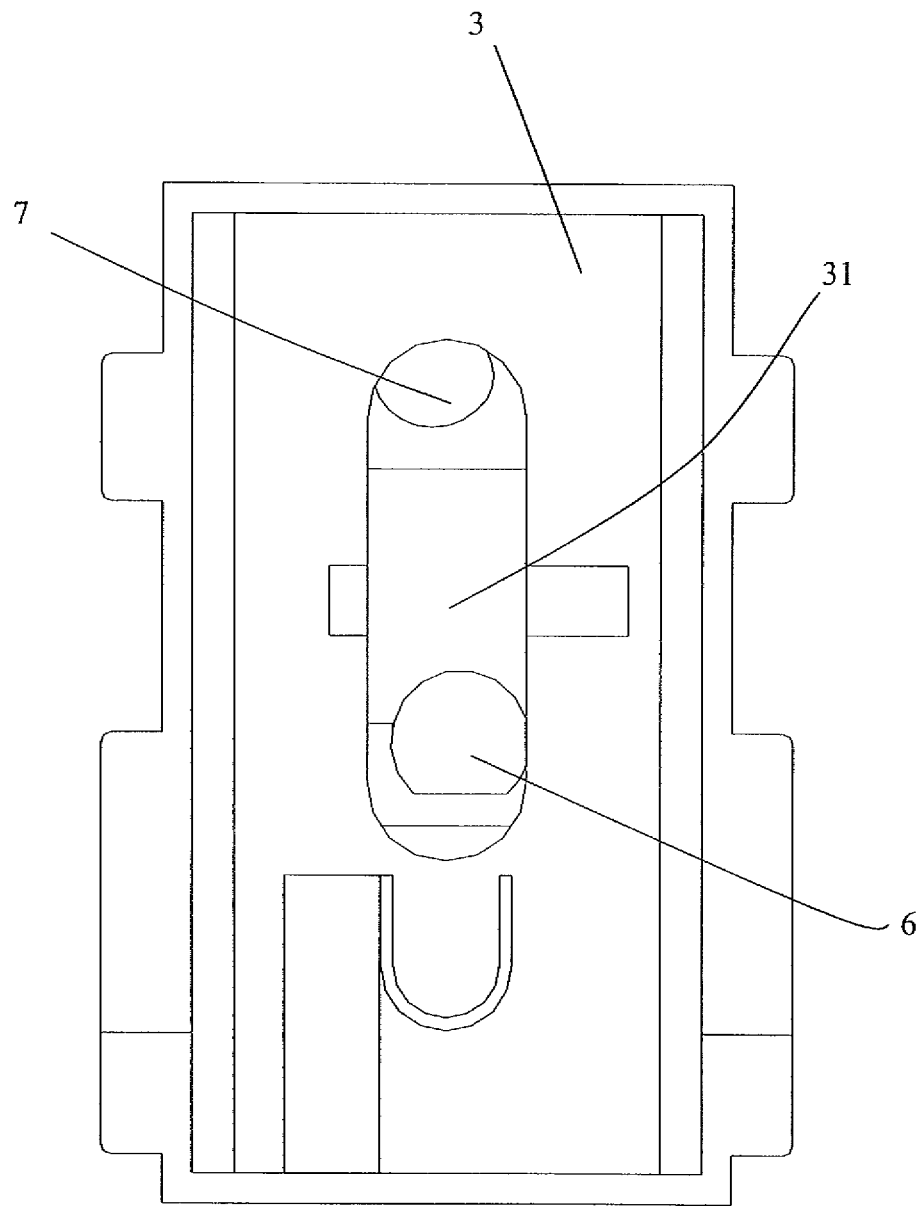
FIG. 3 is the figure of the detailed locations for the emitting and receiving lenses in the housing of the present invention.

FIG. 3 is the figure of the detailed locations for the emitting lens 6 and the receiving lens 7 in the housing 3 of the present invention. Combining what shown in FIG. 2 and FIG. 3, in the embodiment shown in FIG. 3, the housing 3 has a rectangular emitting and receiving panel 31. The optical centre of the emitting lens 6 does not just correspond to the infrared emitting tube 4 that is in the housing 3, but is biased to top right corresponding to the infrared emitting tube 4 (namely the emitting lens 6 locates at the lower right corner of the emitting and receiving panel 31), thus the emitted light is biased after focusing by the emitting lens 6. The optical center of said receiving lens 7 also does not just correspond to the infrared receiving tube 5 that is in the housing 3, but is biased to top left corresponding to the infrared receiving tube 5 (namely the emitting 6 locates at the top left corner of the emitting and receiving panel 31). Consequently, the effective reflected light is sent to the infrared receiving tube 5 effectively after it is focused by the receiving lens 7, meanwhile, the useless reflected light is avoided well.

The relative positions among said emitting lens 6, said receiving lens 7 and the housing 3 is decided by the detailed positions of the infrared emitting tube 4 and the infrared receiving tube 5, and the emitting angle of the light is decided by the relative position between the optical center of the emitting lens 6 and the infrared emitting tube 4. So what FIG. 3 shown is another preferred embodiment of the infrared sensing device 100 in the present invention, and it is easy to be understood and illustrated.

Figure 4:
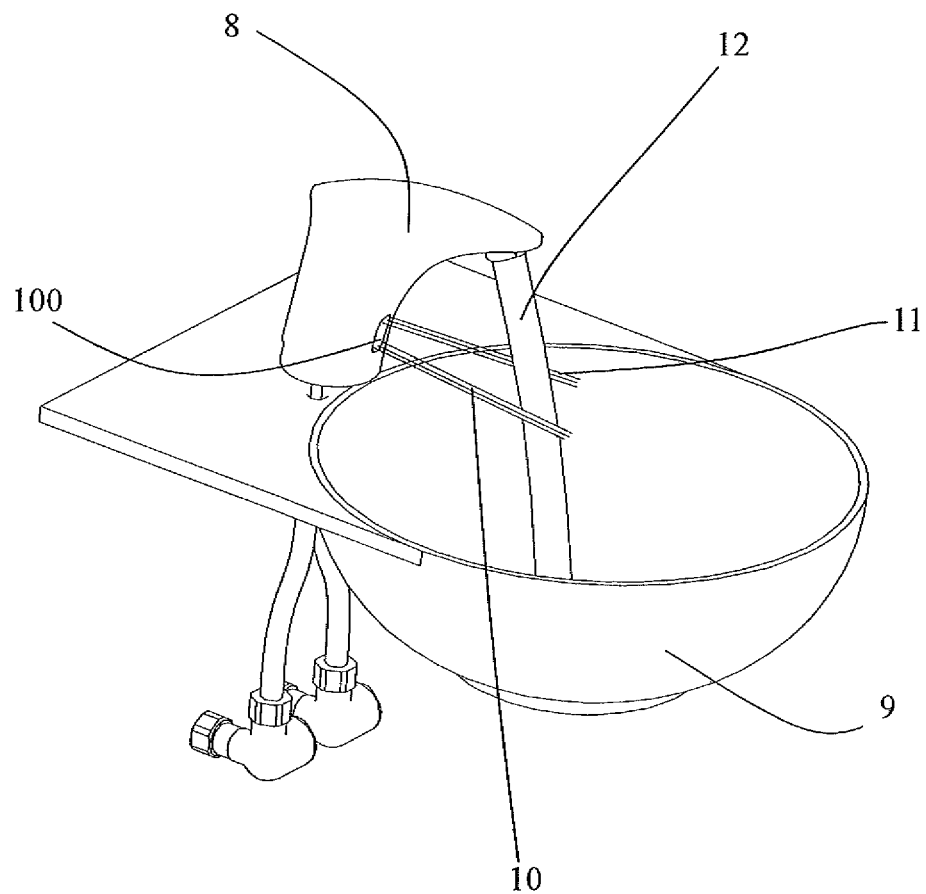
FIG. 4 is the figure for the application example of the infrared sensing device of the present invention.

FIG. 4 is a detailed embodiment for the infrared sensing device 100 applied to the faucet in the present invention. As FIG. 1 to FIG. 4 shown, in the application examples of the infrared sensing faucet, the infrared sensing device 100 in the present invention is mounted in the faucet 8 on the basin 9, when it is energized, the infrared emitting tube 4 will emit the infrared light at fixed frequency; the infrared light can only reach the area where the emitting lens 6 located, as it is hidden by the support branch 2. All light rays beyond the area of the emitting lens 6 are screened. The infrared light from the infrared emitting tube 4 is the diverging light which goes out of the housing 3 in the form of the infrared emitted light 10 after being focused by the emitting lens 6.

The infrared emitted light 10 can approximate to be a parallel light because of the focusing of the lens.

As the optical center of the emitting lens 6 is biased to left or right, the infrared emitted light 10 is biased to have certain of angles of deflection to deviate from the water column 12 in the horizontal direction; the optical center of the emitting lens 6 is biased up, and said infrared emitted light 10 is biased to have certain of angles of deflection in the vertical direction to deviate from the basin 9. The angle of deflection in horizontal and vertical direction is decided by the actual relative position of the infrared sensing device 100 of this invention and the faucet 8. What's more, according to the detailed application environment, the optical center of the infrared sensing device 100 in this invention is only biased left or right, or only up or down to avoid the interfering of the unnecessary emitted light.

Owing to small angle of the deflection of the infrared emitted light 10, the infrared emitting light 10 still reaches at the user's hands as usual when user is washing hands.

To reach better receiving effect, the infrared sensing device 100 of this invention also adopts that the optical center of the receiving lens 7 is biased to enable that the light reflected along the infrared reflected light 11 can shoot at the infrared receiving tube 5 straightly after it is focused, and a little infrared light reflected by the column 12 and the basin 9 (not shown on the figure) only can reach at the support branch 2 and is reflected to the infrared receiving tube 5 again after focused by the receiving lens 7, thus to weaken the intensity of interference light. Among them, the optical center of the receiving lens 7 is biased up to weaken the intensity of the interference light reflected by the basin. The receiving lens 7 is biased to the direction opposite to that the emitting lens 6 biased in the horizontal direction, which weakens the intensity of the interference light reflected by the water column.

The infrared emitted light 10 also can be deflected in slightly larger angle, and no light reaches at the water column and is reflected by the water column 12. In this case, it is unnecessary for the optical center of said receiving lens 7 to be biased, but get better receiving effect.

In another embodiment of the present invention, the infrared emitted light 10 is also not be biased in the vertical direction, at this point, it should be decided by the actual situation, such as whether the height of the basin will cause the reflecting of the light, or the intensity of the reflected light of the basin that would interfere the infrared receiving tube 5 if the reflected light exists.

In the detailed application example in FIG. 4 for the infrared sensing device 100 in this invention, said infrared emitted light 10 is biased in the horizontal direction towards one side. Indeed, the emitting lens of the infrared sensing device 100 in this invention also can be set to two, which enables the infrared emitted light 10 to deflect towards two sides in the horizontal direction. Said emitting lens includes the two emitting lenses biased to left and right respectively corresponding to the infrared emitting tube 4. These two emitting lenses can be set to a whole or set separately.

The lens of the infrared sensing device 100 in this invention can adopt the spherical mirror, and also the non-spherical mirror, such as the cylinder. What is focused on the vertical surface is the parallel light, and what is focused on the horizontal surface is the natural diverging light. In the condition of adopting the cylinder lens, the unnecessary light (shooting at the water column or the basin) will be hidden.

The infrared sensing device 100 of this invention produces a variety of applications in the kitchen and the sanitary area, for instance, it is applied in the intelligent toilet and so on. The infrared sensing device 100 will enable the infrared emitted light to deviate from the barrier to the object or the object area by setting the lens that focuses the infrared light and controls the infrared light direction. After reflecting, the receiving device of this infrared sensing device 100 can receive the effective light when the lens is set to focus the infrared light and control the direction of the infrared light, which can control the corresponding kitchen and sanitary equipments after handling.

It is understood that the preceding description is given merely by way of illustration and not in limitation of the invention and that various modifications may be made thereto without departing from the spirit of the invention as claimed.

The invention claimed is:

1. An infrared sensing device mounted in a faucet for a wash basin, comprising:
    an infrared emitting tube for emitting infrared light;
    an infrared receiving tube for receiving infrared reflected light;
    a housing for accommodating the infrared emitting and receiving tubes;
    an emitting lens which is set correspondingly to the infrared emitting tube to focus the emitted light;
    a receiving lens which is set correspondingly to the infrared receiving tube to focus the reflected light,
    wherein the optical center of said emitting lens is biased upward such that the emitted light is focused above the wash basin at an angle up from horizontal.

2. The infrared sensing device according to claim 1, wherein the optical center of said emitting lens is also biased horizontally such that the emitted light avoids directly intersecting a stream of water from the faucet.

3. The infrared sensing device according to claim 2, wherein the horizontal bias results in the optical center of the emitting lens being directed away from a vertical plane of symmetry of the faucet, wherein the vertical plane of symmetry intersects both the stream of water from the faucet and the emitting lens.

4. The infrared sensing device according to claim 1, wherein said emitting lens, said receiving lens, and said housing are incorporated into a single component.

5. The infrared sensing device according to claim 1, wherein said emitting lens and said receiving lens are not integrated with the housing and are mounted at the housing.

6. The infrared sensing device according to claim 1, further comprising a support branch having a channel for emitting infrared light and a channel for receiving infrared light.

7. The infrared sensing device according to claim 6, wherein the support branch and the housing are incorporated into a single component.

8. The infrared sensing device according to claim 1, further comprising a circuit board, wherein said infrared emitting tube and said receiving tube are mounted on the circuit board.

9. The infrared sensing device according to claim 1, wherein the optical center of said receiving lens is biased to avoid the reflected infrared light interfering with the infrared receiving tube.

10. The infrared sensing device according to claim 9, wherein the optical center of the receiving lens is biased upward such that light reflected from the basin does not interfere with the infrared receiving tube.

11. The infrared sensing device according to claim 10, wherein the optical centers of the emitting lens and receiving lens are horizontally biased in opposite horizontal directions.

12. The infrared sensing device according to claim 11, wherein the horizontal bias results in the optical center of the receiving lens being directed away from a vertical plane of symmetry of the faucet, wherein the vertical plane of symmetry intersects both a stream of water from the faucet and the receiving lens.

13. The infrared sensing device according to claim 1, wherein the infrared light emitting tube and infrared light receiving tube are positioned on a vertical plane of symmetry of the faucet, wherein the vertical plane of symmetry intersects both a stream of water from the faucet and the emitting and receiving lenses.

* * * * *